United States Patent [19]

Musin et al.

[11] Patent Number: 4,503,544
[45] Date of Patent: Mar. 5, 1985

[54] DEVICE FOR PULSE MEASUREMENT AND CONVERSION

[76] Inventors: Rafail M. Musin, studenchesky gorodok, 15, kv. 13; Mikhail I. Gryaznov, ulitsa Omskaya, 12, kv. 26; Dmitry A. Timofeev, pereulok Tkacheva, 4, kv. 3, all of Gorky, U.S.S.R.

[21] Appl. No.: 460,375

[22] Filed: Jan. 24, 1983

[51] Int. Cl.³ .......................................... G01R 19/16
[52] U.S. Cl. ....................................... 375/10; 364/486
[58] Field of Search ............................ 375/10; 370/13; 364/484, 485, 486, 487, 569, 701; 371/15, 3, 24; 324/73 R, 73 AT, 76 R, 77 R, 83 R

[56] References Cited

U.S. PATENT DOCUMENTS

| | | | |
|---|---|---|---|
| 3,573,626 | 4/1971 | Ertman | 375/10 |
| 3,790,767 | 2/1974 | Alexander | 364/486 |
| 3,922,534 | 11/1955 | Gerstenmeier et al. | 364/484 |
| 4,137,497 | 1/1979 | Lowenschuss | 364/484 |
| 4,150,432 | 4/1979 | Sorden | 364/484 |

OTHER PUBLICATIONS

R. M. Musin et al., On Designing Videopulse Shape Coefficient Meter, in Communication Equipment, Radio–Measuring Technique, Moscow, issue 2(34), 1981, pp. 15–20.
R. M. Musin, et al., Designing Pulse Characteristic Meter, Communication Equipment, Radio–Measuring Technique, issue 1(3), Moscow, 1981, pp. 38–45.
M. I. Griaznov, Measuring Pulses by Integrating Techniques, Sovetskoye Radio Publishers, 1975, pp. 226–233, 136–139, 103–144, and 42–60.
Z. V. Magrachev, Single Signal Analog Measuring Converters, Energia Publishers, Moscow, 1974, pp. 77–85.
E. I. Gitis, E. A. Piskunov, Analog-to-Digital Converters, "Energoizdat", Moscow, 1981, pp. 233–241.
A. I. Berezenko, L. N. Koriagin, A. R. Nazarian, High-Speed Microprocessors, Moscow, Radio i Sviaz Publishers 1981, pp. 139–140.

Primary Examiner—Robert L. Griffin
Assistant Examiner—Stephen Chin
Attorney, Agent, or Firm—Lilling & Greenspan

[57] ABSTRACT

A pulse measuring and converting device comprises a unit of integrated pulse converters having nonlinear amplitude response and an integrated pulse converter having linear amplitude response, a synchronizing unit and a converted pulse processing system comprising two low-pass filters coupled to two analog storages which are connected to a channel switch coupled, via an analog-digital converter and a computing unit, to a display unit from which the information is delivered to a general-purpose channel. Successive nonlinear conversion of input pulses, processing of converted pulses by means of a microprocessor computer unit, linear stretching of pulses yield information on characteristics, such as a generalized amplitude and length, area, energy, electric charge, of single and recurrent pulses in the pico-, nano-, micro- and millisecond ranges. The invention can be used in radio-measuring engineering, nuclear physics, laser engineering, and multichannel communication equipment.

4 Claims, 3 Drawing Figures

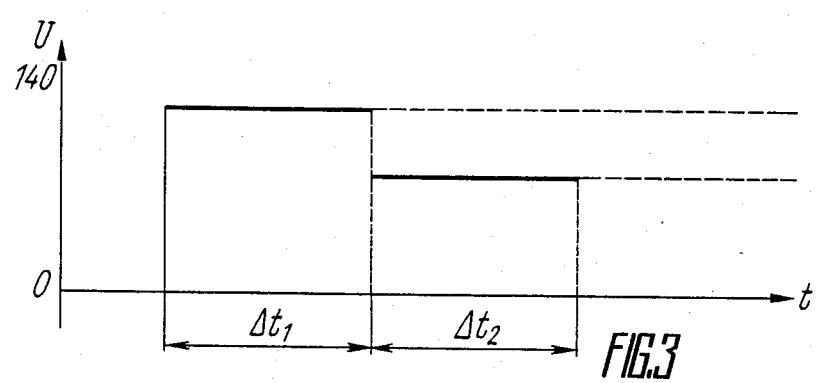

DEVICE FOR PULSE MEASUREMENT AND CONVERSION

FIELD OF THE INVENTION

The present invention relates to pulse technique and, more specifically, to devices for measuring and converting pulses.

The present invention can be used in radio measuring equipment, nuclear physics, laser technique, semiconductor electronics and multichannel communication for the purposes of investigating pulsed signals in pico-, nano- and microsecond length ranges, within a wide spectrum of pulse repetition frequency, including individual signals.

DESCRIPTION OF THE PRIOR ART

Known in the art are devices designed for measuring and converting pulse parameters, including single pulses. The technical characteristics of integrated pulse converters providing for nonlinear conversion and concurrent stretching of input pulses act as a limitation of the device as a whole, in particular the sensitivity of the device, its response, measurement errors and functional capabilities of the device.

Integrated pulse converters, whose amplitude characteristic has a rise in the low frequency region, are attenuators of the useful signal and amplifiers of the low frequency noises. In consequence, integrated meters have limited sensitivity (of the order of 10 mV) with a particular level of errors in measuring pulse characteristics. If sensitivity is preassigned, the errors in measuring pulse characteristics increase, at the expense of noises, as compared to estimated values, particularly for single pulses when no averaging of results for several pulses is possible to reduce such errors.

Considering the above output noises of integrated converters, the sensitivity of this device amounts to 10 mV, whereas errors of measuring pulse characteristics (for single pulses) cannot be brought lower than 10%.

The minimal length of pulses is about 3 to 5 ns. Reducing the pulse length beyond 3 ns, particularly in the picosecond range, results in a sharp increase of noise effects upon the accuracy of pulse characteristic measurements.

Known in the art is a pulse measuring and converting device (cf., for example, M. I. Griaznov, Measuring Pulses by Integrating Techniques, Sovetskoye Radio Publishers, 1975, pp.226–232) comprising integrated pulse converters, for example, two converters having nonlinear amplitude response and one converter having linear amplitude response, whose inputs are joined and form an input of the device for pulse measurement and conversion, while the outputs thereof are coupled to a converted pulse processing system built around logarithmic amplifiers, the measurement results being indicated by pointer instruments.

The above device uses analog processing of converted pulses and integrated converters whose amplitude response is not optimal.

The known device for measuring and converting pulses is insufficiently sensitive and produces substantial errors when processing converted pulses.

SUMMARY OF THE INVENTION

It is an object of the present invention to provide a pulse measuring and converting device which measures pulse characteristics more accurately.

Another object of the invention is to provide a pulse measuring and converting device having wider functional capabilities.

According to the invention there is provided a pulse measuring and converting device comprising an integrated pulse converter having a linear amplitude response and an integrated pulse converter unit comprising two integrated pulse converters having nonlinear amplitude response, the inputs of all the converters being joined to form the input of the pulse measuring and converting device; a synchronizing unit electrically coupled with the output of the integrated pulse converter having linear amplitude response; and a converted pulse processing system connected to the integrated pulse converters. According to the invention, the converted pulse processing system comprises two low-pass filters, the input of the first low-pass filter being connected to the output of the integrated pulse converter unit and the input of the second low-pass filter being connected to the output of the integrated pulse converter having linear amplitude response; two analog storages whose first inputs are connected to the outputs of respective low-pass filters, the second inputs being connected to the first output of the synchronizing unit whose first input is connected to the output of the second low-pass filter, the output of the first analog storage being connected to the capacitor thereof and to the first input of a channel switch, the output of the second analog storage being connected to the capacitor thereof and to the second input of the channel switch, whose third and fourth input are connected to the second and third outputs of the synchronizing unit; an analog-digital converter whose first input is connected to the output of the channel switch, whose second input is connected to the fourth output of the synchronizing unit, and whose first output is connected to the third input of the synchronizing unit; a computing unit whose first input is connected, via a data bus, to the second output of the analog-digital converter, the second and third inputs being connected to the third and fourth outputs of the synchronizing unit, respectively, the fourth input thereof being connected to the second output of the integrated pulse converter unit; and a display unit whose input is connected, via a data bus, to the first output of the computing unit, the output of the display unit being coupled to the general-purpose channel.

It is preferable that the pulse measuring and converting device should comprise a pulse stretching unit and a matching unit connected in series therewith, the input of the pulse stretching unit being the second input of the pulse measuring and converting device, the output of said pulse stretching unit being connected to the fourth input of the synchronizing unit, the first output of the matching unit being connected to the second input of the synchronizing unit and the second output of said matching unit being connected to the fourth input of the second analog storage.

It is possible that the pulse measuring and converting device should also comprise a third low-pass filter and a second integrated pulse converter having linear amplitude response, whose input should be connected to the second output of the first integrated pulse converter having linear amplitude response, the output thereof being connected, via a capacitor, to a housing and to the input of the third low-pass filter; a third analog storage whose first input should be connected to the output of the third low-pass filter, the second input of the analog storage being connected to the first output of the synchronizing unit; an analog-digital converter whose first input should be connected to a capacitor and to the output of the third analog storage and whose second input should be connected to the second output of the computing unit; an additional code forming unit whose first input should be connected, by a data bus, to the output of the second analog-digital converter and whose second input should be connected to the fifth output of the synchronizing unit and whose first output, by a data bus, and the second output should be connected to the fourth and fifth inputs of the computing unit.

The invention provides for a pulse measuring and converting device possessing high sensitivity and accuracy, particularly in the picosecond length range. In addition to measuring generalized characteristics of pulses, the device is also capable of measuring the amplitude of stretched pulses, particularly in the picosecond length range. The present device can be the basis for providing multifunctional pulse characteristic meters for multichannel measurements in nuclear and laser physics.

The proposed device for measuring and converting pulses is rather simple in design and has wide functional capabilities; its application field based on the integrating technique is quite extensive including operation within automated measuring systems.

BRIEF DESCRIPTION OF THE DRAWINGS

The invention will now be described in greater detail, by way of example, with reference to the accompanying drawings, wherein:

FIG. 3 is a graph, showing voltage waveforms explanatory of the sequence of conversion of the analog signal into a code, at the output of the channel switch, according to the invention.

DETAILED DESCRIPTION OF THE INVENTION

Figure 1:
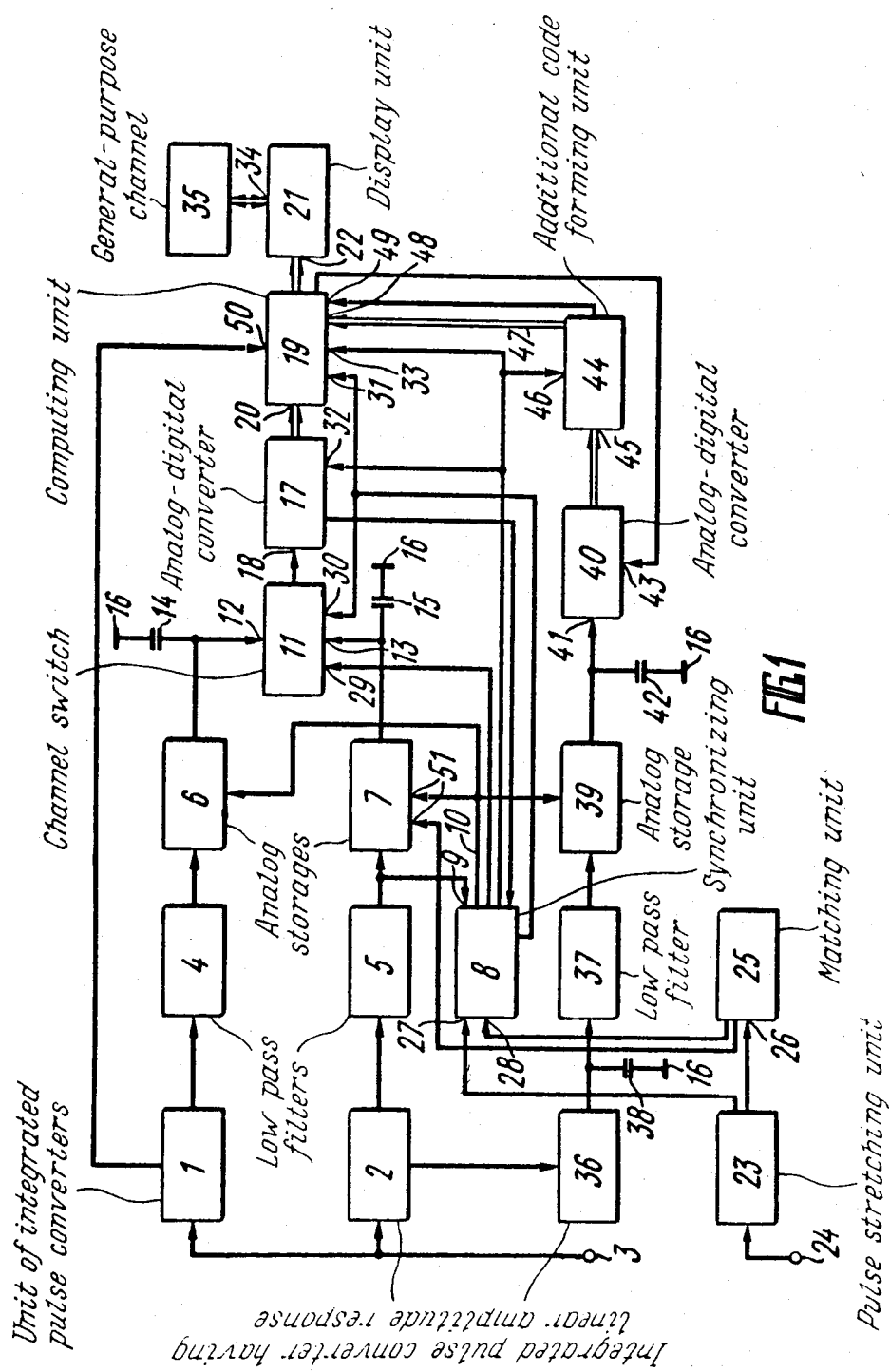
FIG. 1 is a block diagram of a pulse measuring and converting device, according to the invention.

A pulse measuring and converting device comprises an integrated pulse converter unit 1 (FIG. 1), an integrated pulse converter 2 having linear amplitude response, the inputs of all the pulse converters being joined and forming an input 3 of the device. Outputs of the unit 1 and the pulse converter 2 are connected to inputs of low-pass filters 4 and 5, respectively.

The device also comprises analog storages 6 and 7 whose first inputs are connected with outputs of the low-pass filters 4 and 5; a synchronizing unit 8 whose input 9 is connected to the output of the low-pass filter 5 and whose output 10 is connected to second inputs of the analog storages 6 and 7; and a channel switch 11 whose inputs 12 and 13 are connected with the outputs of the analog storages 6 and 7 and, via capacitors 14 and 15, to the housing 16.

In addition, the device comprises an analog-digital converter 17 whose input 18 is connected to the output of the channel switch 11; a computing unit 19 whose input 20 is connected to the output of the analog-digital converter 17; and a display unit 21 whose input 22 is connected to the first output of the computing unit 19.

The device also comprises a pulse stretching unit 23 whose input forms an input 24 of the pulse measuring and converting device; and a matching unit 25 whose input 26 is connected to the first output of the pulse stretching unit 23, the second output of the unit 23 being connected to an input 27 of the synchronizing unit 8. The first output of the matching unit 25 is connected to an input 28 of the synchronizing unit 8. A second output of the synchronizing unit 8 is connected to an input 29 of the channel switch 11, the third output of the synchronizing unit 8 being connected with an input 30 of the channel switch 11 and with an input 31 of the computing unit 19, and the fourth output of the synchronizing unit 8 is connected with an input 32 of the analog-digital converter 17 and with an input 33 of the computing unit 19.

The display unit 21 has an output 34 connected to a general-purpose channel 35.

The device comprises an integrated converter 36 having a linear amplitude response, whose input is connected to the second output of the integrated pulse converter 2, and a low-pass filter 37 whose input is connected to the output of the integrated converter 36 and, via a capacitor 38, to the housing 16.

In addition, the device comprises an analog storage 39 whose first input is connected to the output of the low-pass filter 37 and whose second input is connected to the output 10 of the synchronizing unit 8; an analog-digital converter 40 whose input 41 is connected to the output of the analog storage 39 and, via a capacitor 42, to the housing 16, the input 43 of the analog-digital converter 40 being connected to the second output of the computing unit 19; and an additional code forming unit 44 whose input 45 is connected, via a data bus, to the output of the analog-digital converter 40 and whose input 46 is connected to the third output of the synchronizing unit 8 and whose first output is connected, via a data bus 47, to an input 48 of the computing unit 19 and whose second output is connected to an input 49 of the computing unit 19. The input 50 of the computing unit 19 is connected to the second output of the integrated pulse converter unit 1. The second output of the matching unit 25 is connected to an input 51 of the analog storage 7.

Figure 2:
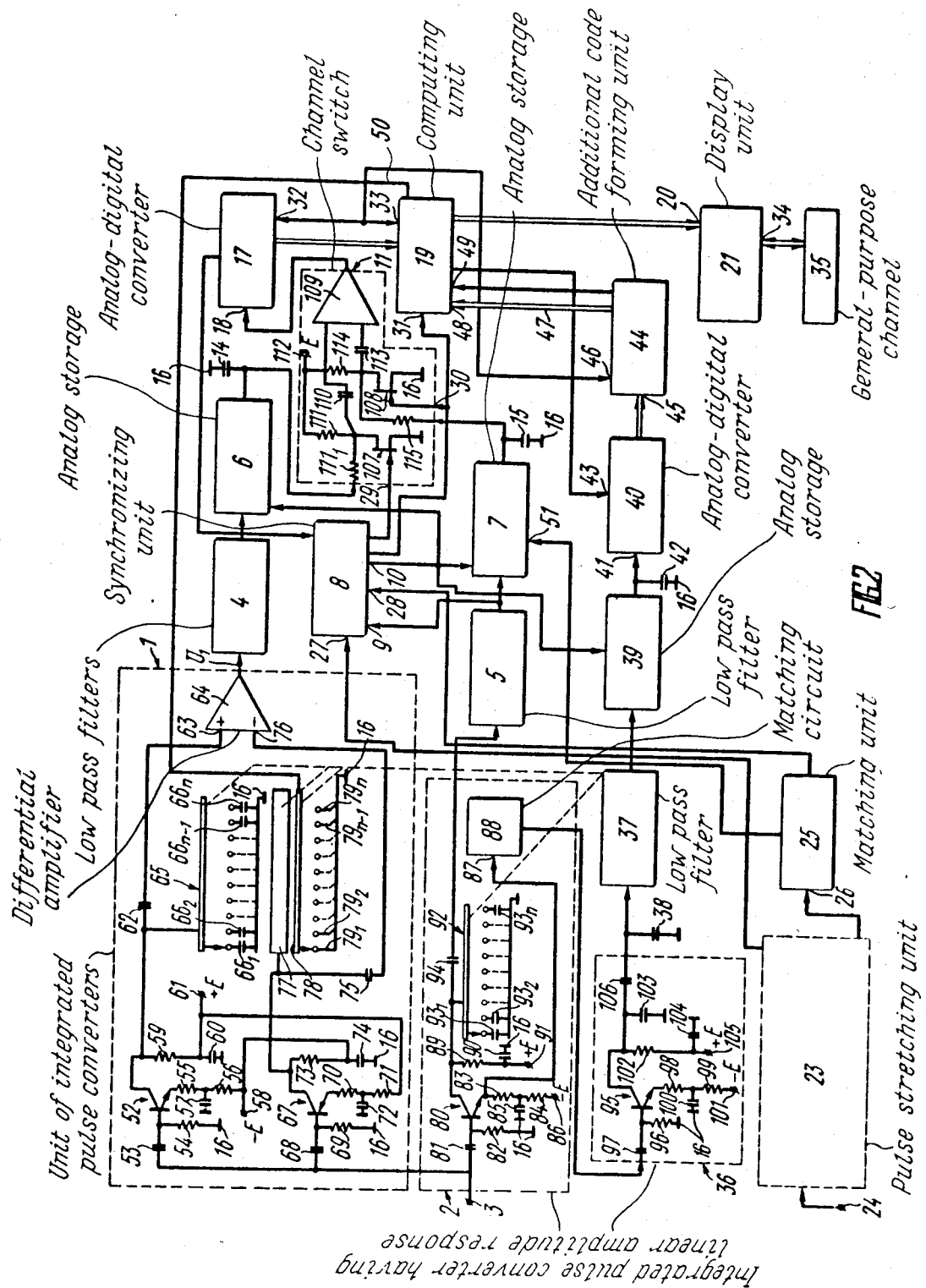
FIG. 2 is a block diagram of a pulse measuring and converting device, according to the invention.

The integrated pulse converter unit 1 (FIG. 2) comprises two integrated pulse converters having nonlinear amplitude response.

One integrated converter is built around a transistor 52 having p-n-p conduction (cf., for example, M. I. Griaznov, Measuring Pulses by Integrating Techniques, Sovetskoye Radio Publishers, 1975, pp.226–233). The base of the transistor 52 is coupled to a capacitor 53 and a leakage resistor 54 whose one lead is connected with the housing 16. The emitter circuit of the transistor 52 comprises resistors 55 and 56 and a capacitor 57 coupled to the housing 16. The lead of the resistor 56 is connected to a power source 58. The collector of the transistor 52 is connected to a resistor 59 and a capacitor 60 coupled to the housing 16. The resistor 59 and the capacitor 60 are joined in a point which is connected to a power source 61. The collector of the transistor 52 is also connected, via a capacitor 62, to an input 63 of a differential amplifier 64. A length band switch 65 having capacitors $66_1, 66_2 \ldots 66_n$ is connected to the collector of the transistor 52.

supplied from the output of the channel switch 11 to the input of the analog-digital converter 17. A signal arriving at the input 32 of the analog-digital converter 17 from the synchronizing unit 8 sets the converter 17 ready to accept the next piece of information. Codes corresponding to the quasi-constant voltages are transmitted via a data bus from the output of the analog-digital converter 17 to the input 20 of the computing unit 19 where the generalized amplitude of pulses is calculated, as well as their length, energy and area. These data are supplied as codes to the display unit 21 and from the output 34 to the general-purpose channel.

The accuracy of measurements of pulse characteristics (such as the generalized amplitude and length) is substantially improved due to introduction of low-pass filters and the digital system of processing of converted pulses.

Improved accuracy of pulse measurement is attributed to the following main factors:

Elimination of the low-frequency noise in the signal transmission channel, which reduces fluctuations of indicator readings, particularly when measuring characteristics of single pulses;

More accurate mathematical operations of finding the generalized amplitude $U_0$ and length $t_1$ through the use of a microprocessor (not shown) in the computing unit.

The microprocessor also makes the field of application of the device wider. Specifically, the energy and the charge of a pulse can be converted into a code and measured, averaging can be introduced to increase the accuracy of recurrent pulses, and information on measured quantities can be transmitted to a general-purpose channel, which means that the device can operate as a part of a measuring system.

In order to reduce errors in measurements of pulse characteristics, which are caused by the low frequency noise introduced into the signal transmission channel due to the rise of the amplitude curve of the integrated pulse converters of the unit 1 and the integrated pulse converter 2 in the area of low frequencies, the investigated signal is supplied from the second output of the integrated pulse converter 2 to the integrated pulse converter 36 having linear amplitude response. At the output of the integrated converter 36 the signal is filtered by the capacitor 38 and the distorted (non-harmonic) low frequency pickup is transferred to the filter 37. A pulsed pickup signal is produced at the output of the filter 37, whose phase and frequency characteristic is identical to that of the pickup signal in the useful signal transmission channel. The low frequency noise signal is transformed in the analog storage 39 into a quasi-constant voltage and, further on, into a code in the analog-digital converter 40. The code of the low frequency noise is delivered to the additional code forming unit 44 which digitally compensates, in accordance with an assigned algorithm, this low frequency noise in the useful signal transmitting channel. The control is excercised by the computing unit 19.

The second integrated converter 36 having linear amplitude response and digital compensation of the low-frequency noise in the signal transmission channel of the first integrated converter 2 also contributes to more accurate measurements of pulse characteristics.

An additional measuring channel is also provided in the device in order to improve the accuracy and reduce errors in measurements, as well as to furnish non-oscillographic meters for multi-channel measuring of pulse amplitudes in the pico- and nano-second length range.

The pulses to be analyzed are fed from the input 24 to the pulse stretching unit 23 where short input pulses are linearly stretched which means that a single pulse is converted into a pulse train or a pulse which is longer than the input pulse. This quasi-sequence is supplied from the first output of the pulse stretching unit 23 to the input 27 of the analog storage 7, and from the second output, via the matching unit 25, to the input 28 of the synchronizing unit 8 wherein a control pulse is shaped to match in time either the maximum of pulses in the quasi-sequence of pulses or the maximum of any pulse in this quasi-sequence. The signal of the matching unit 25 is sent to the analog storage 7 whose output is a quasi-constant voltage, the amplitude thereof being the function of pulses at the input 24.

Introduction of the stretching unit 23 and the matching unit 25 results in higher sensitivity of the device and more accurate measurement of amplitudes of pulses in the pico-second length range. The duration of pulses can in this case be stretched to whole seconds.

To summarize, the introduction of the converter 36, the filter 37, the analog-storage 39, the analog-digital converter 40, the unit 44, the pulse stretching unit 23 and the matching unit 25 provides for:

Higher accuracy of measuring of generalized pulse characteristics, such as the generalized amplitude and duration, energy and area, through compensation of low-frequency noise in the useful signal transmitting channel;

Higher sensitivity and accuracy of measuring of the amplitude of pulses in the pico- and nano-second length range through introduction of an additional channel for conversion of a single pulse into a quasi-sequence of pulses;

Broader functional capabilities of fields of application of the pulse measuring and converting device;

Let us deal in more detail with the operation of a pulse measuring and converting device.

The pulses to be analyzed are supplied via the capacitor 53 (FIG. 2) and the leakage resistor 54 to the base of the transistor 52. The operating current of the transistor 52 is selected in the part of the voltage-current characteristics, which is described by an exponential function $$F_1 \sim e^{\lambda U_m} - 1, \qquad (1)$$

where $\lambda$ is the curvature of the voltage-current characteristic. $\lambda$ can be corrected by the resistor 55 by straightening the voltage-current curve through negative feedback. The resistor 56 is intended to do the selection of a specific operating current for the transistor 52. The capacitors 57 and 60 are signal filters in the power supply circuit.

The second integrated converter in the unit 1 operates in a similar manner.

Pulses are supplied via the capacitor 68 and the leakage resistor 69 to the base of the transistor 67. The operating current of the transistor 67 is set by selecting a resistor 71, while the resistor 70 makes corrections for the value $\lambda$, which defines the voltage-current curve described as $$F_2 \sim 1 - e^{-\lambda U_m}, \qquad (2)$$

through negative feedback, where $U_m$ is the amplitude of input pulses.

The capacitors 72 and 74 are to filter the signal in the power supply circuits. The load resistors 59 and 73 are The other integrated pulse converter of the unit 1 is built around a transistor 67 having n-p-n conduction (cf., for example, M. I. Griaznov, Measuring Pulses by Integrating Technique, Sovetskoe Radio Publishers, 1975, pp.226–233). The base of the transistor 67 is connected with a capacitor 68 and a leakage resistor 69 whose one lead is connected to the housing 16. The emitter circuit of the transistor 67 comprises resistors 70 and 71 and a capacitor 72 connected to the housing 16. The lead of the resistor 71 is connected to the power source 61. The collector of the transistor 67 is connected to a resistor 73 and a capacitor 74 connected to the housing 16. The resistor 73 and the capacitor 74 are joined in a point connected to the power source 58. The collector of the transistor 67 is also connected, via a capacitor 75, to an input 76 of the differential amplifier 64. The collector of the transistor 67 is connected to a length band switch 77 and a length band switch 78 having contact sets $79_1$, $79_2 \ldots 79_n$, which is mechanically connected with the switches 77 and 65.

The integrated pulse converter 2 is built around a transistor 80 whose base is connected to a capacitor 81 and a leakage resistor 82 whose one lead is connected to the housing 16. The emitter circuit of the transistor 80 comprises resistors 83 and 84 and a capacitor 85 connected to the housing 16. The output of the resistor 84 is connected to a power source 86. The emitter of the transistor 80 is connected to an input 87 of a matching circuit 88 built around a field transistor using a source follower circuit.

The collector of the transistor 80 is connected with a resistor 89 and a capacitor 90 connected to the housing 16. The resistor 89 and the capacitor 90 are joined in a point connected to a power source 91. The collector of the transistor 80 is connected with a switch 92 having capacitors $93_1$, $93_2$, ... $93_n$. The switch 92 is mechanically connected with the switches 65, 77 and 78. The collector of the transistor 80 is also connected, via a capacitor 94, to the input of the filter 5.

Some leads of the capacitors 53, 68 and 81 are joined and form the input 3 of the pulse measuring and converting device.

The integrated pulse converter 36 is built around a transistor 95 whose base is connected to a resistor 96 and a capacitor 97 whose one lead is connected to the output of the matching circuit 88. The emitter circuit of the transistor 95 comprises resistors 98 and 99 and a capacitor 100 connected to the housing 16. One lead of the resistor 99 is connected to a power source 101.

The collector circuit of the transistor 95 comprises a resistor 102, a capacitor 103 and a capacitor 104. Some leads of the capacitors 103 and 104 are coupled to the housing 16. The resistor 102 and the capacitor 104 are connected in a point coupled to a power source 105. The collector of the transistor 95 is connected, via a capacitor 106, to the input of the filter 37.

The channel switch 11 comprises field transistors 107, and 108 and a summing amplifier 109. One lead of the summing amplifier 109 is connected to a capacitor 110 and resistors 111 and $111_1$. One lead of the resistor 111 is connected to the power source 112, while one lead of the resistor $111_1$ is connected to the output of the analog storage 6. The point of connection of the capacitor 110, and resistors 111 and $111_1$ is connected to the drain of the field-effect transistor 107.

Another input of the summing amplifier 109 is connected to a capacitor 113 and resistors 114 and 115. One lead of the resistor 114 is connected to the power source 112. One lead of the resistor 115 is connected to the output of the analog storage 7. The point of connection of the capacitor 113 and resistors 114 and 115 is coupled to the drain of the field-effect transistor 108.

Drains of the field-effect transistors 107 and 108 are connected to the housing 16, while control gates are connected to the second and third outputs of the synchronizing unit 8, respectively.

The output of the summing amplifier 109 is connected to the input 18 of the analog-digital converter 17.

The sensitivity of a pulse measuring and converting device can be increased, if errors in measuring pulse characteristics are preassigned, on the following conditions:

Reduction of the output noise level of integrated pulse converters, which is only possible when characteristics of integrated converters are optimized (cf., R. M. Musin, M. I. Griaznov, I. Yu. Filatov, On Designing Videopulse Shape Coefficient Meter, in Communication Equipment, Radio-Measuring Technique, Moscow, issue 2(34), 1981, pp.15–20, in Russian) Indeed, in this case various pickups are compensated by the difference signal produced in the subtraction unit (not shown). But noises in the signal channel remain, when the signal is coming from an integrated pulse converter having linear amplitude response;

Reduction of errors in the converted pulse processing system. This can be attained by replacing the analog processing system by a digital one (R. M. Musin, D. A. Timofeev, M. I. Griaznov, Designing Pulse characteristic Meter, Communication Equipment, Radio-Measuring Technique, issue 1(3), Moscow, 1981, pp.38–45, in Russian);

Provision, if the length of pulses is reduced to less than 5 ms, particularly in the picosecond length range, of an additional pulse amplitude measuring channel eliminating the effects of pickups (noises) at the outputs of integrated converters;

Provision of an additional channel comprising a second integrated pulse converter having linear amplitude response, a low-pass filter, an analog storage, an analog-digital converter, and an additional code forming unit, which is aimed to compensate, digitally, low frequency pickups in the channel transmitting signals from the integratec converter having linear amplitude response.

The pulse measuring and converting device operates as follows.

Pulses applied to the input 3 (FIG. 1) are converted both nonlinearly and linearly in the unit 1 and the integrated converter 2. They are stretched and supplied to the inputs of the low-pass filters 4 and 5 eliminating low frequency pickups in the signal transmission channel. Pickups are usually distorted due to non-harmonic nature of the pickup signal and the output noises of the filters 4 and 5 are pulsed, their length being commensurate with the duration of exponentially shaped stretched pulses. Such exponentially shaped pulses are fed to the analog storages 6 and 7 where the signal can be sampled by means of a short control pulse produced in the synchronizing unit 8 and stretched by means of the capacitors 14 and 15.

Quasi-constant voltages whose amplitudes are the function of $U_1$ and $U_2$ are applied to the inputs 12 and 13 of the channel switch 11 which alternately connects the outputs of the analog storages 6 and 7 to the input of the analog-digital converter 17 by means of a control signal supplied from the output of the synchronizing unit 8. The quasi-constant voltages $U_1$ and $U_2$ are alternately selected to satisfy the relationship $RC \cong 30\ t_1max$, where $t_1max$ is the maximum length of pulses in a specific subrange, which is dictated by the capacitance of the capacitors $66_1, 66_2 \ldots 66_n$ of the pulse length b and switch 125.

A switch 126 mechanically connected with the switches 125 and 79 provides for transmission of a character indication signal to the computing unit 19.

Exponentially-shaped pulses whose length exceeds the length of input pulses by a factor of thirty are supplied from the resistors 59 and 73, via the capacitors 62 and 75, to the inputs 63 and 76 of the differential amplifier 64. Exponentially-shaped pulses are produced at the output of this amplifier, whose amplitude is proportional to the square of the pulse amplitude at the input 3.

Concurrently, pulses are supplied from the input 3 of the device to the integrated converter 2. These pulses are delivered, via the capacitor 81 and the leakage resistor 82, to the base of the transistor 80. A larger resistor 83 inserted into the emitter circuit provides for a deep negative feedback, which produces substantial linearization of the voltage-current curve of the transistor 80.

The resistor 84 is used to set the operating current of the transistor 80. The capacitors 85 and 90 filter the signal in the power supply circuit.

The signal from the emitter of the transistor 80 is fed to the input 87 of the matching circuit 88 built around a field-effect transistor using the source follower circuit. The signal is further transmitted from the output of the matching circuit 88, via the capacitor 97 and the leakage resistor 96, to the base of the transistor 95.

The integrated pulse converter 36 is analogous to the above integrated converter 2 and has a linear amplitude response too.

The load of the transistor 95 is the resistor 102 and the capacitor 103 whose magnitude remains unchanged in various length bands. In this case the magnitude of the capacitor 103 is selected to be much larger than the maximum possible magnitude of a capacitor in the maximum pulse length range. No stretched pulses are present at the output of the integrated converter 36, it is restricted to the noise signal whose phase-frequency characteristic is close to that of the noise signal at the output of the integrated pulse converter 2.

The pulse stretching unit 23 can be built around a length of a coaxial cable or an artificial delay line (cf., Z. V. Magrachev, Single Signal Analog Measuring Converters, Energia Publishers, Moscow, 1974, pp. 77–85).

The exponentially shaped stretched pulses have an amplitude which is proportional to:

the second power of the input pulse amplitude, at the output of the summing amplifier 64; and the first power of the input pulse amplitude, at the output of the integrated converter 2.

This can be represented as follows:

$$U_1 \sim U^2_m \cdot t_1;\ U_2 \sim U_m \cdot t_1, \qquad (3)$$

where $U_m$ and $t_1$ are the amplitude and length of the input pulse.

These signals are supplied to the filters 4 and 5 which are intended to filter out the low-frequency noise divisible by 50 Hz. The output signals thereof are fed to the analog storages 6 and 7 wherein sampling of the signal is done by means of a short control pulse produced in the synchronizing unit 8 and these samples are stored in the capacitors 14 and 15. In consequence, quasi-constant voltages whose amplitudes are the function of $U_1$ and $U_2$ are generated at the outputs of the analog storages 6 and 7 (cf., M. I. Griaznov, Measuring Pulses by Integrating Techniques, Sovetskoe Radio Publishers, 1975, pp. 136–139, 103–114, in Russian).

The channel switch 11 alternately connects the outputs of the analog storages 6 and 7 to the input of the analog-digital converter 17 for periods required to convert analog signals into a n-digit code.

The channel switch 11 operates as follows.

Quasi-constant voltages are supplied from the outputs of the analog storages 6 and 7 to the inputs of the channel switch 11.

The control signal coming from the third output of the synchronizing unit 8 opens the field-effect transistor 108. As a result, the quasi-constant voltage is supplied, within the time $\Delta t_1$ of operation of the analog-digital converter 17, from the output of the analog storage 6 to the input of the summing amplifier 109 without attenuation, and from the output of the analog storage 7 with attenuation. From the output of the summing amplifier 109 the analog signal is fed to the input of the analog-digital converter 17. When the operation of the analog-digital converter 17 is over, a termination signal is generated therein and is fed, from the output of said analog-digital converter 17, to the input of the synchronizing unit 8 which produces control signals to open the transistor 107 and close the transistor 108 to the channel switch 11.

The analog signal taken from the output of the analog storage 7 during the time interval $\Delta t_2$ (FIG. 3) is applied to the input of the analog-digital converter 17.

The analog-digital converter 17 (FIG. 2) converts analog signals into the binary code (E. I. Gitis, E. A. Piskunov. Analog-Digital Converters."Energoizdat", Moscow, 1981, pp. 233–241). The coded signals are transmitted from the output of the analog-digital converter 17 via a data bus to the input of the computing unit 19 wherein codes are divided, multiplied and converted in accordance with a specific program. The mathematical and logical operations are performed by a microprocessor (not shown). Concurrently, the input 50 of the computing unit 19 receives coded signals on engaged pulse length and amplitude bands which define the dimensions of indicated values.

The computing unit 19 operates according to signals fed from the fourth output of the synchronizing unit 8 and the output of the analog-digital converter 17. The computing unit 19 produces information for arbitrarily shaped input pulses (cf., M. I. Griaznov, Measuring Pulses by Integrating Technique, Sovetskoye Radio Publishers 1975, pp. 136–139, 103–114) about the charge Q and energy W of the pulse $$Q \sim \frac{U_2}{R_o} = \frac{U_m \cdot t_1}{R_o} S_1$$

$$W \sim \frac{U_2}{R_o} = \frac{U_m^2 \cdot t_1}{R_o} S_2 \qquad (4)$$

where $R_o$ is the input resistance of the device, $S_1$ and $S_2$ are some shape coefficients characteristic of the measured pulses.

The computing unit 19 also generates information about the generalized amplitude $U_o$ and length $t_1$ of the pulses $$U_o \approx \frac{U_2}{U_1} = U_m \frac{S_2}{S_1} = U_m \cdot K_1 \quad (5)$$

where $U_m$ is the pulse amplitude, $K_1$ is the pulse shape coefficient (cf., M. I. Griaznov, Measuring Pulses by Integrating Technique, Sovetskoye Radio Publishers, Moscow, 1975, pp. 42-60, in Russian).

This information is fed to the display unit 21 and therefrom, via a data bus, to a general-purpose channel so that the meter could be hooked up with external devices.

There is provided a channel in order to eliminate the effect of low-frequency pickup caused by the amplitude-frequency characteristic of the integrated converter 2 (such as the rise of the curve in the lower frequency spectrum of the signal) and, consequently, to improve the accuracy of measuring of pulse characteristic. This channel comprises:

- the integrated pulse converter 36;
- the low pass filter 37;
- the analog storage 39;
- the analog-digital converter 40; and
- the additional code forming unit 44.

Each of these units operates exactly like similar units described above. The only exception are two units 36 and 40. The integrated pulse converter 36 built around the transistor 95 is completely analogous to the integrated pulse converter 2. But the load capacitor 103 of the integrated pulse converter 36 is selected so that the magnitude thereof "supreses" the useful signal and lets through only the low-frequency noise.

In order to retain the phase relationship between signals in the first and second integrated converters having linear amplitude response, the signal-plus-noise is supplied to the input of the integrated converter 36 from the emitter load, that is the resistor 83 of the transistor 80, via the circuit 88. In consequence, the output of the integrated pulse converter 36 is only the low-frequency noise. This signal is passed through the filter 37. A quasi-constant voltage which is the function of the low-frequency noise is produced at the output of the analog storage 39.

The analog signal is converted, in the analog-digital converter 40, into a digital code and fed, via a data bus, to the input 45 of the additional code forming unit 44 whose input 46 receives a control signal from the fourth output of the synchronizing unit 8.

The additional code forming unit 44 is an on-line storage whose memory holds information on the amplitude of the low-frequency noise (A. I. Berezenko, L. N. Koriagin, A. R. Nazarian. High-Speed Microprocessors. Moscow, Radio i Sviaz Publishers 1981, pp. 139-140, in Russian).

The noise information is fed, via a data bus, to the input 48 of the computing unit 19 concurrently with the address signal incoming from the second output of the additional code forming unit 44. Having received this information, the computing unit 19 automatically compensates the low frequency noise, the signal is freed of the noise, which substantially reduces fluctuations of readings and displayed values, or, in other words, increases the accuracy of measurements of pulse characteristics.

When the duration of pulses to be measured diminishes to tens of picoseconds or to tenths of nanoseconds, the ratio signal/noise is reduced drastically, resulting in considerable increase of errors in measuring pulse characteristics. In this connection the input 24 of the device can be useful. When pulses are applied to this input 24, the pulse stretching unit 93 transforms short pulses, particularly single ones, into a quasi-sequence or a pulse having an equivalent length $n.t_1$, where $t_1$ is the duration of the investigated pulse (Z. V. Magarachev. Single Pulse Analog Measuring Converters. Energia Publishers, Moscow, 1974, pp. 77-85), in Russian).

The signal taken from the output of the pulse stretching unit 23 is supplied, via the matching unit 25 which can be just a broad-band amplifier having a high input resistance, to the synchronizing unit 8 in order to generate a control pulse and a reset signal for the analog storage 7. Pulses from the matching unit 25 are applied to one of the inputs of the analog storage 7 wherein they are sampled and stored in the memory of the storage 7.

The present invention provides a device for measuring and converting pulses, particularly in the picosecond pulse length range, possessing high sensitivity and accuracy.

This device can be a basic unit of multifunctional pulse characteristic meters for multichannel measurements in the field of nuclear and laser physics.

What is claimed is:

1. A device for pulse measurement and conversion and for delivery of converted pulses to a general purpose channel, comprising:

a first integrated pulse converter having linear amplitude response and a second integrated pulse converter unit comprising two integrated pulse converters having non-linear amplitude responses, allowing for stretching of input pulses to obtain an amplitude of stretched pulses which is a linear function of the duration of pulses and, respectively, a quadratic or linear function of the amplitude of input pulses said second integrated pulse converter unit having an input, a first output, and a second output, and said first integrated pulse converter having an input, and an output, said inputs of said first and second integrated pulse converters being joined together and forming a first input of the device for measurement and conversion of pulses;

a synchronizing unit forming control and synchronizing signals for the operation of the device for measurement and conversion of pulses and having a first output, a second output, a third output, a fourth output, a first input and a second input; and a system for processing converted pulses, comprising:

a first low pass filter and a second low pass filter filtering low frequency noises in the signal transmitting channel an input of said first low pass filter being connected to said first output of said second integrated pulse converter, an input of said second low pass filter being connected to said output of said first integrated pulse converter, said first low pass filter having an output and said second low pass filter having an output connected to said first input of said synchronizing unit;

a first analog storage and a second analog storage converting pulsed voltages into quasi-constant voltages, a first input of said first analog storage being connected to said output of said first low pass filter, a first input of said second analog storage being connected to said output of said second low pass filter, second inputs of said first and second analog storages being connected to said first output of said synchronizing unit, said first and second analog storages each having an output;

a first capacitor and a second capacitor respectively connected to said outputs of said first and second analog storages;

a first analog-digital converter having a first input, a second input, a first output and a second output, said second input of said first analog-digital converter being connected to said third output of said synchronizing unit and said first output of said first analog-digital converter being connected to said second input of said synchronizing unit;

a channel switch alternating connection of analog signals to said analog-digital converter and having a first input, a second input, a third input, a fourth input and an output, said output of said first analog storage being connected to said first capacitor and to said first input of said channel switch, said output of said second analog storage being connected to said second capacitor and to said second input of said channel switch, said third input of said channel switch being connected to said second output of said synchronizing unit, said fourth input of said channel switch being connected to said fourth output of said synchronizing unit, said first input of said first analog-digital converter being connected to said output of said channel switch;

a computing unit performing arithmetic and logical operations with converted quantities, and having input connected, via a first data bus, to said second output of said first analog-digital converter, second and third inputs connected to said fourth and third outputs of said synchronizing unit, respectively, a fourth input connected to said second output of said second integrated pulse converter, fifth and sixth inputs and a first output;

a display unit having an input connected, via a second data bus, to said first output of said computing unit, and an output connected by a third data bus, to a general-purpose channel.

2. A device as claimed in claim 1, further comprising:

a pulse stretching unit having an input serving as a second input of the device for measurement and conversion of pulses, and first and second outputs; and a matching unit having an input, a first output and a second output, said first output of said pulse stretching unit being connected to said input of said matching unit, said first output of said matching unit being connected to a third input of said synchronizing unit, said second output of said pulse stretching unit being connected to a fourth input of said synchronizing unit, and said second output of said matching unit being connected to a third input of said analog storage.

3. A device as claimed in claim 1, further comprising:

a third low pass filter having an input and an output;

a third integrated pulse converter having linear amplitude response and having an input connected to a second output of said first integrated pulse converter, and an output connected to a third capacitor and to said input of said third low pass filter;

a third analog storage having a first input connected to said output of said third low pass filter, a second input connected to said first output of said synchronizing unit, and an output;

a second analog-digital converter having a first input connected to a fourth capacitor and to said output of said third analog storage, a second input connected to a second output of said computing unit, and an output; and an additional code forming unit having a first input connected by, by a fourth data bus, to said output of said second analog-digital converter, a second input connected to said third output of said synchronizing unit, a first output connected, by a fifth data bus, to a fifth input of said computing unit, and a second output connected to a sixth input of said computing unit.

4. A device as claimed in claim 2, further comprising:

a third low-pass filter having an input and an output;

a third integrated pulse converter having linear amplitude response and having an input connected to a second output of said second integrated pulse converter and an output connected to a third capacitor and to said input of said third low pass filter;

a third analog storage having a first input connected to said output of said third low pass filter, a second input connected to said first output of said synchronizing unit, and an output a second analog-digital converter having a first input connected to a fourth capacitor and to said output of said third analog storage, a second input connected to a second output of said computing unit; and an additional code forming unit having a first input connected, by a fourth data bus, to said output of said second analog-digital converter, a second input connected to said third output of said synchronizing unit, a first output connected, by a fifth data bus, to a fifth input of said computing unit, a second output connected to a sixth input of said computing unit.

* * * * *